(12) United States Patent
De Silva et al.

(10) Patent No.: US 10,998,192 B2
(45) Date of Patent: May 4, 2021

(54) SEQUENTIAL INFILTRATION SYNTHESIS EXTREME ULTRAVIOLET SINGLE EXPOSE PATTERNING

(71) Applicant: International Business Machines Corporation, Armonk, NY (US)

(72) Inventors: Ekmini Anuja De Silva, Slingerlands, NY (US); Jing Guo, Niskayuna, NY (US); Luciana Meli, Albany, NY (US); Nelson Felix, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/570,603

(22) Filed: Sep. 13, 2019

(65) Prior Publication Data

US 2021/0082697 A1 Mar. 18, 2021

(51) Int. Cl.
*H01L 21/033* (2006.01)
*H01L 21/027* (2006.01)

(52) U.S. Cl.
CPC ...... *H01L 21/0337* (2013.01); *H01L 21/0274* (2013.01); *H01L 21/0332* (2013.01)

(58) Field of Classification Search
CPC ............. H01L 21/0337; H01L 21/0274; H01L 21/0332
USPC ........................................................ 438/703
See application file for complete search history.

(56) References Cited

U.S. PATENT DOCUMENTS

| | | | |
|---|---|---|---|
| 8,173,034 B2 | 5/2012 | Millward et al. | |
| 9,388,268 B2 | 7/2016 | Gopalan et al. | |
| 9,487,600 B2 | 11/2016 | Darling et al. | |
| 9,646,883 B2 | 5/2017 | Brink et al. | |
| 9,684,234 B2 * | 6/2017 | Darling | H01L 21/3065 |
| 9,916,980 B1 * | 3/2018 | Knaepen | C23C 16/045 |
| 2012/0241411 A1 | 9/2012 | Darling et al. | |
| 2013/0256265 A1 | 10/2013 | Darling et al. | |
| 2013/0280912 A1 * | 10/2013 | Ogihara | C07F 7/1804 |
| | | | 438/694 |

OTHER PUBLICATIONS

US 9,871,003 B2, 01/2018, Fujiwara (withdrawn)
J. Guo et al., "Polymer Brush as Adhesion Promoter for EUV Patterning," Proceedings of SPIE, Apr. 9, 2018, 13 pages, vol. 105860I.
I. Seshadri et al., "Ultrathin EUV Patterning Stack Using Polymer Brush as an Adhesion Promotion Layer," Proceedings of SPIE, Mar. 24, 2017, 12 pages, vol. 101431D.
M. Baryshnikova et al., "Sequential Infiltration Synthesis for Line Edge Roughness Mitigation of EUV Resist," Journal of Photopolymer Science and Technology, Jun. 2017, pp. 667-670, vol. 30, No. 6.

* cited by examiner

*Primary Examiner* — Vu A Vu
(74) *Attorney, Agent, or Firm* — Abdy Raissinia; Ryan, Mason & Lewis, LLP

(57) ABSTRACT

A method includes depositing a resist layer onto a hard mask layer to form a multi-layer patterning material film stack on a semiconductor substrate, directing patterning radiation onto the film stack to form a developed pattern in the resist layer and exposing the film stack to at least one gas precursor in connection with a sequential infiltration synthesis process. The film stack is configured to facilitate selective infiltration of the at least one gas precursor into the resist layer.

20 Claims, 7 Drawing Sheets

SEQUENTIAL INFILTRATION SYNTHESIS EXTREME ULTRAVIOLET SINGLE EXPOSE PATTERNING

BACKGROUND

The present application relates to manufacturing of semiconductor integrated circuits, and more particularly to patterning of semiconductor integrated circuit features using lithography processes incorporating a Sequential Infiltration Synthesis (SIS) technique.

As part of the ongoing world-wide effort to reduce integrated circuit device dimensions, a variety of single-pattern and multiple-pattern lithography processes based on deep ultraviolet (DUV) radiation wavelengths such as 193 nanometers (nm) have come into widespread use, although further extension of such arrangements to the patterning of features at production nodes below 10 nm may be too complex. Recent development of extreme ultraviolet (EUV) lithography processes using wavelengths such as 13.5 nm are expected to facilitate patterning of features at sub-10 nm production nodes with simpler patterning schemes, but there remains significant difficulties in the practical implementation of EUV processes. For example, conventional techniques in some cases fail to provide a resist layer that exhibits sufficient etch selectivity relative to an underlying hard mask layer. This can lead to, or increase, pattern transfer defects such as line breaks and line bridging in the photoresist during an etching process. Additionally, elimination of line bridge defects caused by scumming of EUV resist between lines generally requires a resist descum process after lithographic pattern development which further reduces resist thickness available for a subsequent hard mask etch.

SUMMARY

In one illustrative embodiment of the present invention, a method comprises depositing a resist layer onto a hard mask layer to form a multi-layer patterning material film stack on a semiconductor substrate, directing patterning radiation onto the film stack to form a developed pattern in the resist layer and exposing the film stack to at least one gas precursor in connection with a sequential infiltration synthesis process. The film stack is configured to facilitate selective infiltration of the at least one gas precursor into the resist layer.

In another illustrative embodiment of the present invention, a multi-layered patterning film stack comprises a hard mask layer and a patterned resist layer on the hard mask layer. One of the hard mask layer and the resist layer is configured to facilitate selective infiltration of at least one gas precursor of a sequential infiltration synthesis process into the resist layer.

In another illustrative embodiment of the present invention, a semiconductor structure comprises a semiconductor substrate and a multi-layer patterning material film stack disposed on the semiconductor substrate. The film stack comprises at least a hard mask layer and a resist layer disposed over the hard mask layer where the resist layer is patterned. The film stack is configured to facilitate selective infiltration of at least one gas precursor of a sequential infiltration synthesis process into the resist layer.

Other embodiments will be described in the following detailed description of embodiments, which is to be read in conjunction with the accompanying figures.

DETAILED DESCRIPTION

Figure 1:
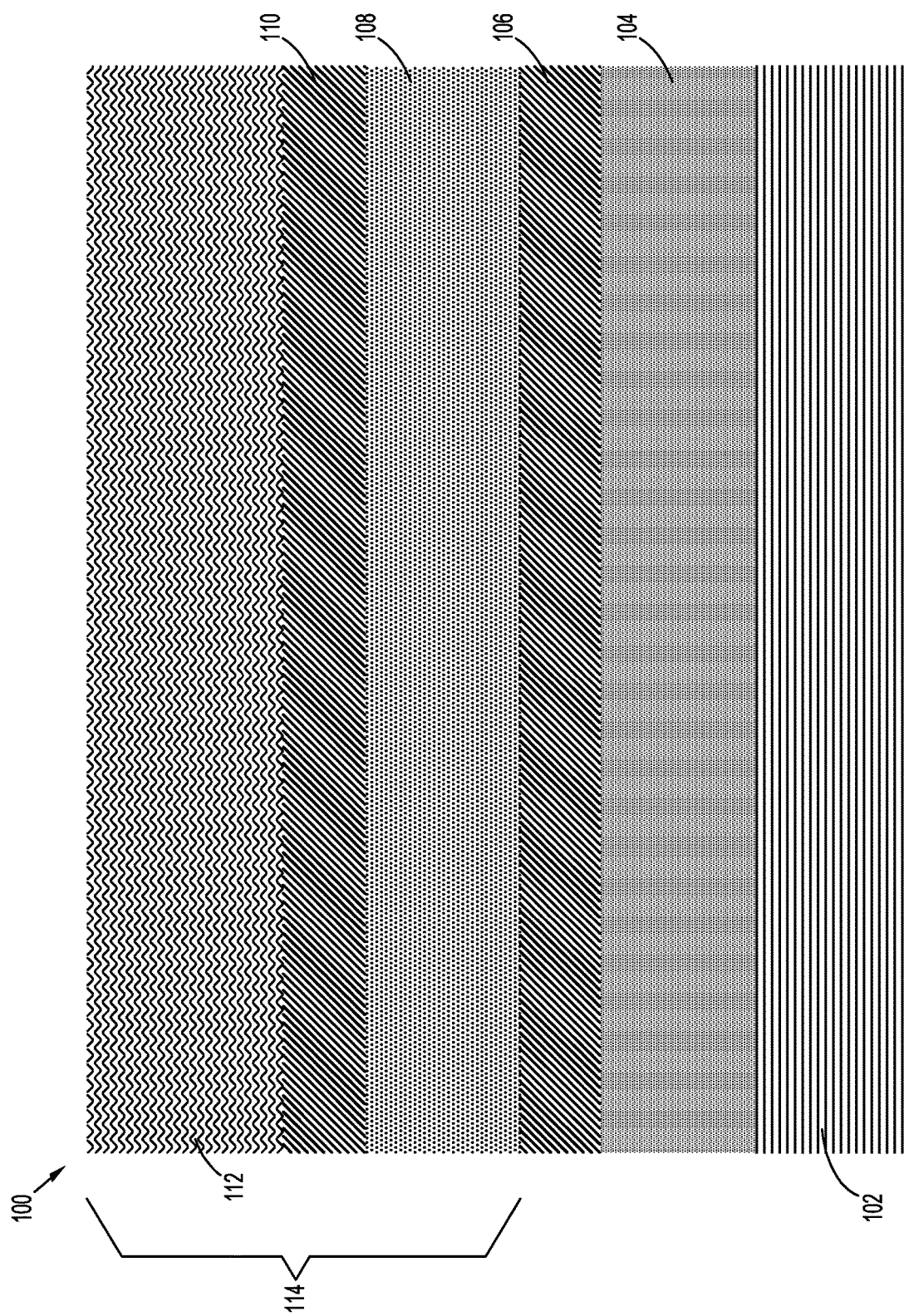
FIG. 1 is a cross-sectional view of a semiconductor structure following an early formation of the semiconductor substrate according to one or more illustrative embodiments of the present invention.

Illustrative embodiments are described herein in the context of a sequential infiltration synthesis (SIS) technique applied in an extreme ultraviolet (EUV) lithography process for patterning material film stacks and hard mask layers. The EUV lithographic process creates a pattern of alternating resist lines and trench openings (hereinafter "openings") within the photoresist layer (hereinafter "resist layer"). The SIS technique contemplated infuses at least one or more precursors, e.g., an inorganic element into the resist layer of the film stack, to increase the etch resistance of the resist layer, by, for example, forming a metal framework on the resist lines, thereby facilitating removal of bridges formed within the openings and enhancing the patterning etch process(es) subsequently performed on the underlying hard mask layer. Examples of suitable precursors include a metal or metal containing compound such as an inorganic protective etch component comprises a metal oxide or a metal. Suitable metal oxides include, but are not limited to $Al_2O_3$, $ZnO$, $SiO_2$, $HfO_2$, $ZrO_2$, $Nb_2O_5$ and $TiO_2$. Moreover, in illustrative embodiments, the resist layer subjected to the infiltration of the one or more precursors is dramatically more resistant to etching with no degradation to the pattern, and is capable of minimizing bridging and line breaking at line space pitches of 40 P and even lower. In addition, enhanced etch resistance of the resist layer may eliminate the need for multiple intermediate hard masks and the concomitant costs and pattern fidelity losses. Furthermore, by enabling an increased etch resistance in the resist layer or film, this approach can improve the final pattern resolution and pattern transfer defectivity.

It is to be understood that illustrative embodiments are not limited to these illustrative arrangements, but are instead more broadly applicable to a wide variety of different lithography processes, patterning material film stacks, hard mask layers and other features and functionalities. For example, other embodiments are not limited to use with any particular single-pattern or EUV lithography process but can be applied to a wide variety of other types of lithography processes, including both single-pattern and multiple-pattern deep ultraviolet (DUV) lithography processes. Also, the particular arrangements of layers utilized within the patterning material film stack can be varied in other illustrative embodiments. Moreover, the particular components of the hard mask layer and its manner of formation can be varied in other illustrative embodiments. These and numerous other variations in the disclosed arrangements will be apparent to those skilled in the art.

Illustrative embodiments involve configuring the film stack to support selective infiltration of the precursor associated with a SIS process into the resist layer while avoiding infiltration of the precursor into the underlying hard mask layer. This will strengthen the etch resistance of the resist layer to minimize thinning of the resist layer, facilitate removal of line bridging within the resist layer and minimize line breaking. For example, the hard mask layer in some illustrative embodiments comprises a grafted polymer brush material on at least part of the hard mask layer aligned with, or corresponding to, the openings of the patterned resist layer. The polymer brush material impedes infiltration of the precursor of the SIS technique into the hard mask layer. Alternatively, or additionally, a self-assembled monolayer is grated on portions of the resist layer for a similar function. The polymer brush may comprise a low molecular weight polymer such as polymethyl methacrylate (PMMA) configured to react with the one or more precursors of the SIS process to cause infiltration of the one or more precursors within the resist layer while avoiding infiltration of the precursor into the hard mask layer aligned with the openings in the resist layer. These and other embodiments can allow for increased height as well as width of the resist layer, thereby avoiding problems that might otherwise arise due to resist thinning during etching of the hard mask layer. Moreover, illustrative embodiments provide enhanced etch selectivity and associated improvements in pattern transfer between the resist layer and the hard mask layer. This can in turn lead to lower defect rates in lithographic pattern transfer and corresponding reductions in integrated circuit manufacturing costs.

FIGS. 1 through 7 show a portion of an EUV lithography process involving the formation of a film stack configured to be subjected to a SIS process to increase the strength of the patterned resist layer to facilitate subsequent etching processes of the underlying hard mask layer. The EUV lithography process is applied to a semiconductor wafer in conjunction with the manufacture of integrated circuits. The figures illustrate respective cross-sectional views of a portion of the semiconductor wafer as it undergoes sequential processing operations as part of the EUV lithography process. It should also be noted that references herein to formation of one layer or structure "on" or "over" another layer or structure are intended to be broadly construed, and should not be interpreted as precluding the presence of one or more intervening layers or structures.

Referring initially to FIG. 1, a semiconductor structure 100 represents a portion of a semiconductor wafer having a semiconductor substrate 102. At least portions of the semiconductor substrate 102 may be formed of silicon (Si), and may have a thickness of about 500 to 1000 micrometers (μm). The semiconductor substrate 102 may itself comprise multiple layers, although it is shown as a single layer in the figure, again for clarity and simplicity of illustration. The semiconductor structure 100 further comprises a first dielectric layer 104 of low k dielectric material on top of the semiconductor substrate 102. The first dielectric layer 104 comprises a first dielectric material including a layer of ultra "low k" insulating/dielectric material such as silicon oxide (e g. $SiO_2$), silicon nitride (SiN), silanol (SiOH), hydrogenated silicon nitride (SiNH), silicon carbide (SiC), silicon carbon nitride (SiCN), hydrogenated silicon carbide (SiCH) fluorine-doped silicon oxide (SiOF), carbon doped oxide (CDO), SiOC films or SiOCH low-k films and other similar types of insulating/dielectric materials or porous dielectrics. The first dielectric layer 104 may be formed using known deposition techniques, such as, for example, ALD (atomic layer deposition), CVD (chemical vapor deposition), PECVD (plasma-enhanced CVD), or PVD (physical vapor deposition), or spin-on deposition.

A hard mask film or layer 106 is then deposited on the first dielectric layer 104. The hard mask film or layer 106 may include any suitable material, such as, for example, a titanium nitride (TiN) or metal oxides including titanium oxide (TiOx), SiARC, SiON, $SiO_2$, TiARC, etc. and can have a thickness of about 5 nm to about 50 nm. The hard mask layer 106 may be deposited on the first dielectric layer 104 using any known techniques including, for example, a plasma enhanced atomic layer deposition (PEALD) process, a plasma-enhanced chemical vapor deposition (PECVD) process or a physical vapor deposition (PVD) process, CVD, ALD, etc. Thereafter, an organic planarizing layer (OPL) 108 is deposited onto the semiconductor structure 100, specifically, the hard mask layer 106. The OPL 108 in some embodiments is formed to a thickness of approximately 60 nm, although these and other dimensions are presented herein as illustrative examples and should not be construed as limiting. The OPL 108 is deposited from solution, e.g., by any conventional deposition process, and is baked at high temperature. The OPL 108 may be self-leveling and may achieve planarization over the surface topography without the use of etching, chemical mechanical polishing, or other conventional planarization techniques. The OPL 108 can include an organic polymer made up of a light-sensitive material that, when exposed to electromagnetic (EM) radiation, is chemically altered and thus configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). The layer of OPL 108 may have a thickness in ranging from about 50 nm to about 500 nm.

With continued reference to FIG. 1, a hard mask layer 110 is formed over the OPL 108. The hard mask layer 110 is illustratively formed of titanium nitride or tantalum nitride, although a wide variety of other inorganic or organic materials could be used. The hard mask layer 110 in this embodiment is another layer of the multi-layer patterning material film stack, overlying the OPL 108. The hard mask layer 110 may have a thickness in the range of about 3 nm to 15 nm. The hard mask layer 110 is illustratively formed at least in part by a deposition process, such as atomic layer deposition (ALD), chemical vapor deposition (CVD) or physical vapor deposition (PVD). Such deposition processes are followed in some embodiments by surface pretreatment processes and/or material grafting processes, as will be described in more detail below.

Referring still to FIG. 1, a resist layer 112 is formed over the hard mask layer 110. This semiconductor structure 100 includes a multi-layer patterning material film stack 114 that includes at least the hard mask layer 110, and the resist layer 112, and may further include the OPL 108 as shown. The resist layer 112 comprises a photosensitive material suitable for patterning using an EUV radiation source and a corresponding photomask. The resist layer 112 illustratively comprises an organic EUV photoresist, and more particularly an organic chemically-amplified photoresist, although other types of resist materials can be used. The resist layer 112 may have a thickness in the range of about 10 nm to 30 nm. The resist layer 112 may be subject to a post-application bake (PAB) process, at a temperature of about 150° C., although other processes can be used.

In other illustrative embodiments, the multi-layer patterning material film stack 114 can include additional or alternative layers underlying the resist layer 112. Accordingly, the particular multi-layer patterning material film stack shown in the figure is presented by way of illustrative example only. A given such film stack will generally comprise a resist layer formed over one or more additional layers including at least a hard mask layer. The one or more additional layers in the present example comprise the OPL 108 and the hard mask layer 110, although once again other additional or alternative layers can be used.

Figure 2:
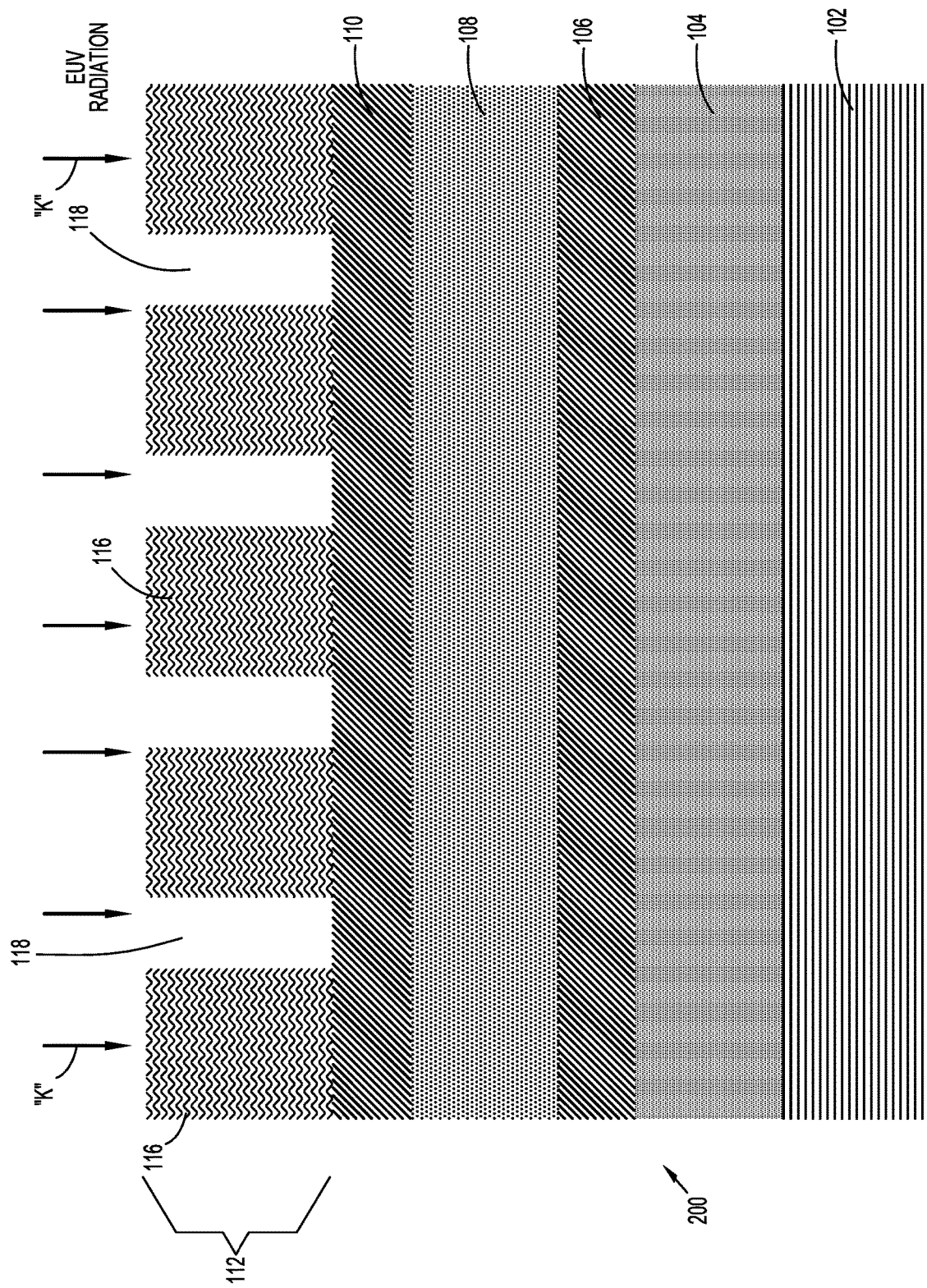
FIG. 2 is a cross-sectional view of a semiconductor structure under exposure to EUV radiation in conjunction with patterning of the resist layer according to one or more illustrative embodiments of the present invention.
Figure 3:
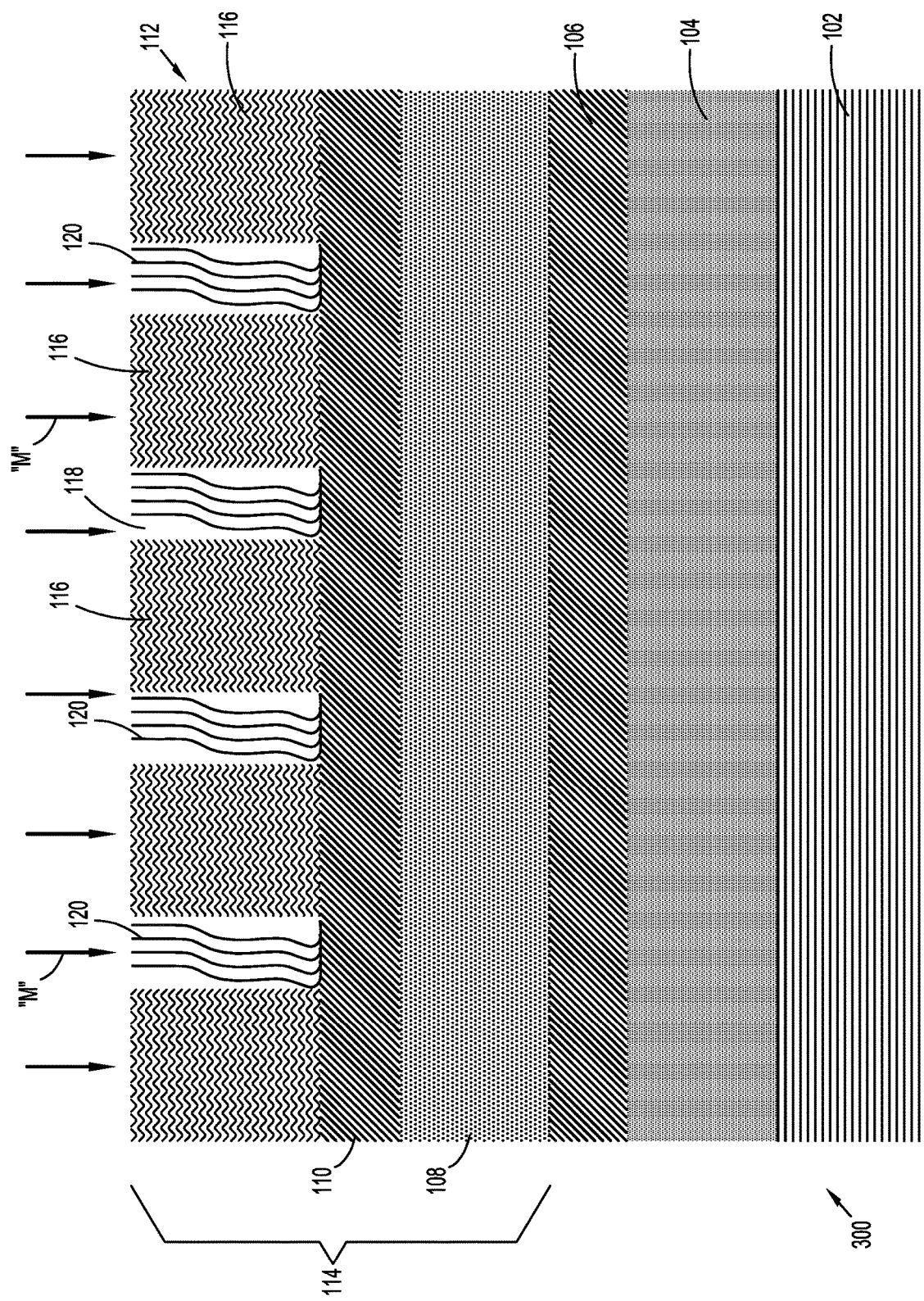
FIG. 3 is a cross-sectional view of a semiconductor structure with a polymer graft within the openings of the resist layer and exposure to one or more gas precursors of a SIS process according to one or more illustrative embodiments of the present invention.
Figure 4:
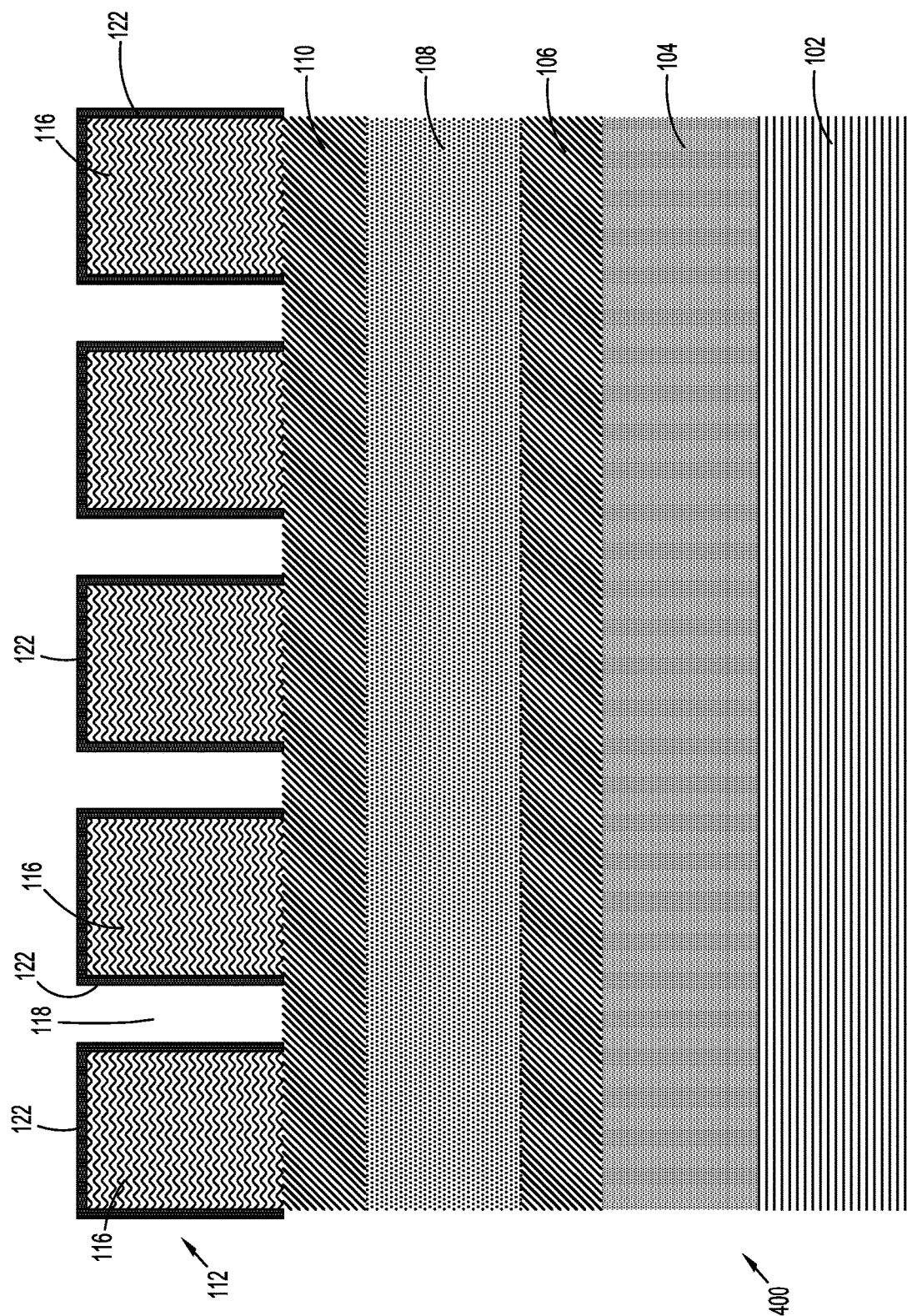
FIG. 4 is a cross-sectional view of a semiconductor structure with a self-assembled monolayer grafted onto at least portions of the resist layer and exposure to one or more gas precursors of a SIS process according to one or more illustrative embodiments of the present invention.

Referring now to FIG. 2, the multi-layer patterning material film stack 114 is exposed to EUV patterning radiation (illustrated as rays "K") to form a desired pattern in the resist layer 112. The pattern includes features such as alternating resist lines 116 and trench openings 118 in the resist layer 112. The resulting semiconductor structure 200 includes a patterned resist layer 112 as depicted in FIG. 2. The patterned resist layer 112 may then be developed using a developing solution. In some illustrative embodiments, a resist descum process is used after forming the patterned resist layer 112 in order to remove resist scumming between adjacent resist lines 116. For example, a plasma-based resist scum removal process may be used. These and other resist descum processes tend to reduce the thickness of the patterned resist layer 112. Development of the patterned resist layer 112 results in a "developed resist layer." The developed resist layer 112 is also considered a type of "patterned resist layer" as the latter term is broadly used herein. With reference now to FIG. 3, the film stack 114 of the semiconductor structure 300 is configured to facilitate selective infiltration of the at least one gas precursor of the SIS process, represented as "M." into the resist layer 112 while minimizing exposure of the precursor with the hard mask layer 106, particularly, portions of the hard mask layer associated with, corresponding to, or in communication with the trench openings 118. In one illustrative embodiment, a polymer brush material 120 is grafted to the hard mask layer 110 within the openings of the resist layer 112. One suitable polymeric brush material is polystyrene or copolymers thereof containing, for example, fifty percent (50%) of polystyrene and/or polysulfone, although other types of materials can be used. The polymer brush material 120 impedes infiltration of at least one precursor of the SIS process through the brush material 120 and into the underlying hard mask layer 110. Thus, the hard mask layer 110 is not exposed to the one or more precursors of the SIS process, which minimizes the potential of interacting with the material of the hard mask layer 110 thereby preventing the formation of a metal layer or bridging between adjacent resist lines 116. However, the resist layer 112 is exposed to the one or more precursors "M" of the SIS process. The one or more precursors "M" infiltrate(s) the resist layer 112, e.g., the resist lines 116, to thereby increase the etch resistance of the resist lines 116 of the resist layer 112 for a subsequent etching process. In particular, as best depicted in FIG. 4, the SIS process forms a metal framework or casing 122 on the organic resist layer 112, for example, around the resist lines 116, which increases the etch selectivity to the underlying organic or silicon based underlayer forming the semiconductor structure 400. Therefore, aggressive etch chemistries can be used to open the line scumming/bridging defects without consuming the resist lines 116 and causing line breaks.

The polymer brush material 120 as described above may be grafted to the hard mask layer 110 by chemical attachment to the hard mask layer 110. Accordingly, the particular configuration of polymer brush material 120 used as grafted material in some embodiments may be selected at least in part based on the material used to form the hard mask layer 110, and may form a part of the hard mask layer. The polymer brush can be functionalized to graft selectively to the trench area and not to the resist polymer of the resist layer 112. This brush polymer is chosen as a material that will inhibit the SIS process from infusing the trench area so that the SIS precursor can infiltrate the resist lines 116 selectively.

In another illustrative embodiment, the polymer brush material 120 may be grafted to the hard mask layer 110 prior to depositing the resist layer 112. The grafted material will form part of the underlayer underneath the resist layer 112 and it will be exposed once the resist layer 112 is developed in the trench openings 118 and can function to prevent the infiltration of the SIS precursors to the open area as described in the previous paragraph. Once formed, sections of the brush material 120 would extend within the trench openings 118 of the resist layer 112 in a similar manner to that disclosed in FIG. 3.

Figure 5:
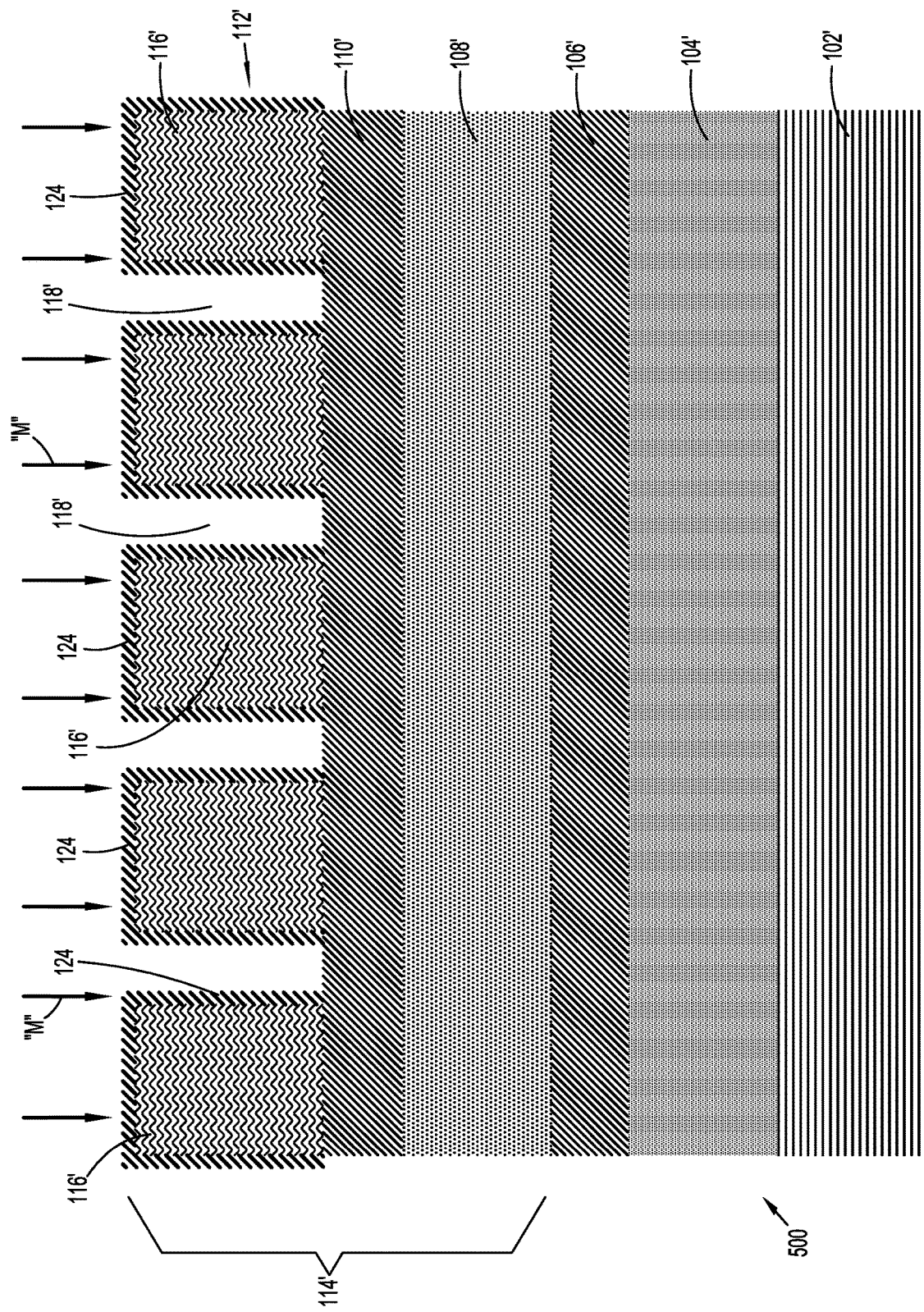
FIG. 5 is a cross-sectional view of a semiconductor structure with a metal casing formed onto at least portions of the resist layer upon exposure to the SIS process according to one or more illustrative embodiments of the present invention.

Referring now to FIG. 5, another illustrative embodiment of a semiconductor structure 500 including a film stack 114' configured for facilitating selective infiltration of the at least one gas precursor of the SIS process into the resist layer 112' is illustrated. In accordance with this illustrative embodiment, after EUV patterning of the resist layer 112', a descum process may be utilized as discussed hereinabove to assist in removing residue within the trench opening(s) 118'. Thereafter, a polymer brush material 124 is applied or coated onto the resist layer 112' including the resist lines 116' with the trench openings 118' being free from the coating. For example, a self-assembled polymer monolayer may be grafted onto at least portions of the resist layer 112' including the resist lines 116'. The monolayer polymer graft material 124 is configured to facilitate infiltration of the at least one gas precursor into the resist layer 112'. More specifically, the monolayer graft material 124 is highly functionalized to react with resist layer 112' (e.g., via a chemical reaction) such that the one or more precursors of the SIS process "M" infiltrate the resist layer 112'. Due at least in part to this interrelationship, infiltration of the one or more precursors with the hard mask layer 110' is impeded. In one illustrative embodiment, the polymer graft material 124 includes a low molecular weight polymer such as polymethyl methacrylate (PMMA) having a molecular weight ranging from about 2K to 10K, and which is conducive to infiltration. Other acrylate-based materials are also contemplated. It is envisioned that the SIS process in this embodiment would produce a metal casing 126 (FIG. 6) on the organic resist layer 112', for example, around the resist lines 116' generally similar in configuration to that described in connection with FIG. 4 although the materials may be different.

The configuration of the film stack 114, 114' to support selective disposition, grafting or coating of a polymer brush material 120, 124 on either or both the hard mask layer 110, 110' or the resist layer 112, 112' as disclosed herein provides significant advantages over conventional arrangements. For example, the film stack 114, 114' as configured in accordance with the methodologies herein facilitate the infiltration of the one or more precursors into the resist layer 112, 112' and not within the hard mask layer 110, 110'. This greatly strengthens the resist layer 112, 112' (e.g., increases etch resistance) to accommodate a subsequent etching process(es), and also provides an enhanced etch selectivity and associated improvements in pattern transfer between the resist layer 112, 112' and the hard mask layer 110, 110'. Such arrangements reduce pattern transfer defects such as line breaks that might otherwise occur due to resist thinning during an etching process which is targeting the removal of bridge defects with pattern transfer.

Figure 6:
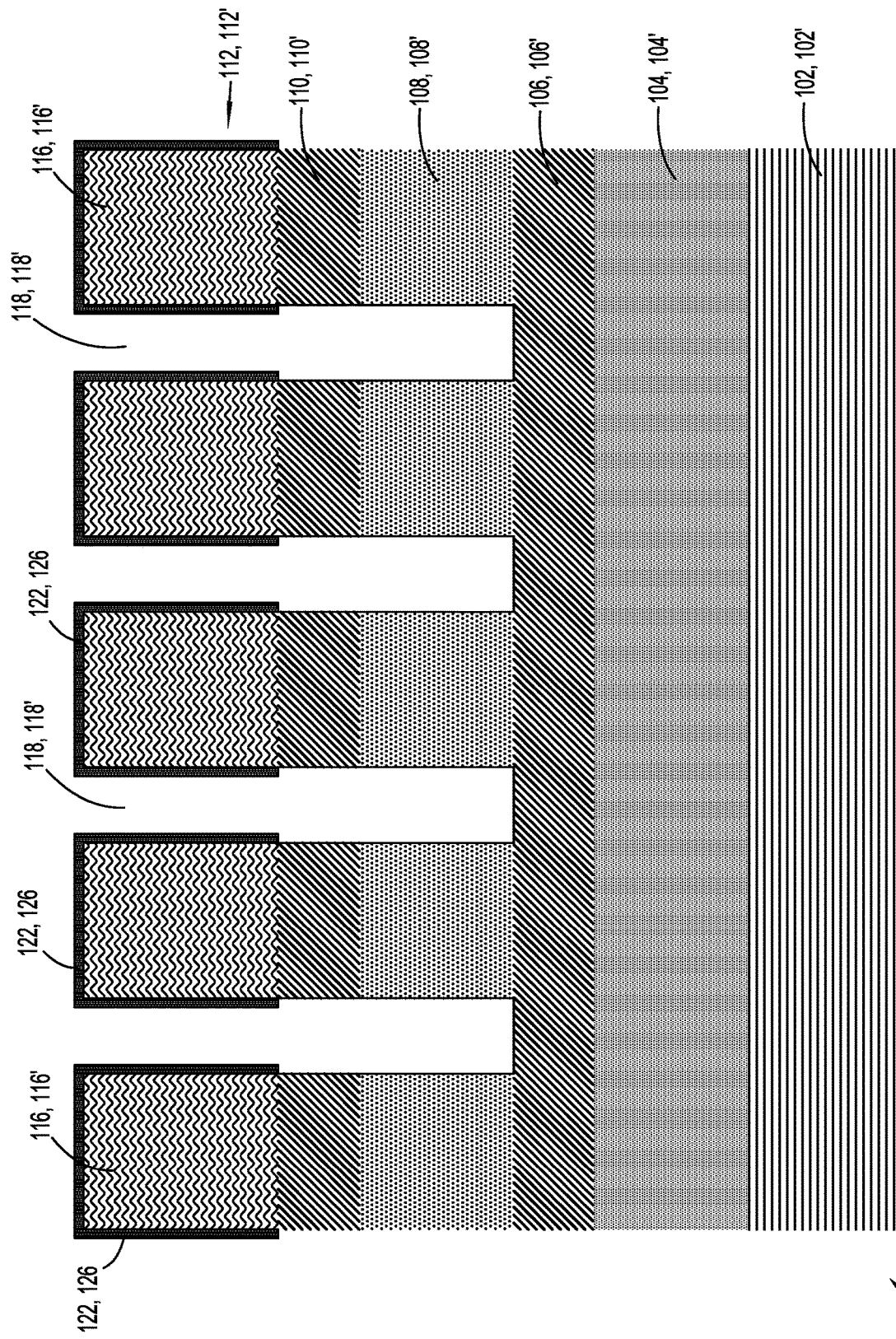
FIG. 6 is a cross-sectional view of a semiconductor structure following etching of the hard mask layer in accordance with a pattern formed in the resist layer according to one or more illustrative embodiments of the present invention.

Referring now to FIG. 6, utilizing the pattern of photoresists 112, 112' of either the embodiments of FIGS. 1-4 or FIG. 5, the underlying structures are etched using a conventional etching process to produce the semiconductor structure 600. This part of the process results in transfer of the pattern from the developed resist layer 112, 112' to pattern the hard mask layer 106, 106' as shown, and eventually etch the pattern into the underlying low-k material of the first dielectric layer 104, 104'. The etching can be performed using a process such as reactive ion etching (RIE) (with, e.g., a halogen-based plasma chemistry) or wet etching. The metallic framework or coating 122, 126 on the resist lines 116, 116' permits aggressive etching without consuming or causing line breaks of the resist lines 116, 116'. It is assumed in this embodiment that the graft material is fully removed as a result of the etching process, although this need not be the case in other embodiments.

Figure 7:
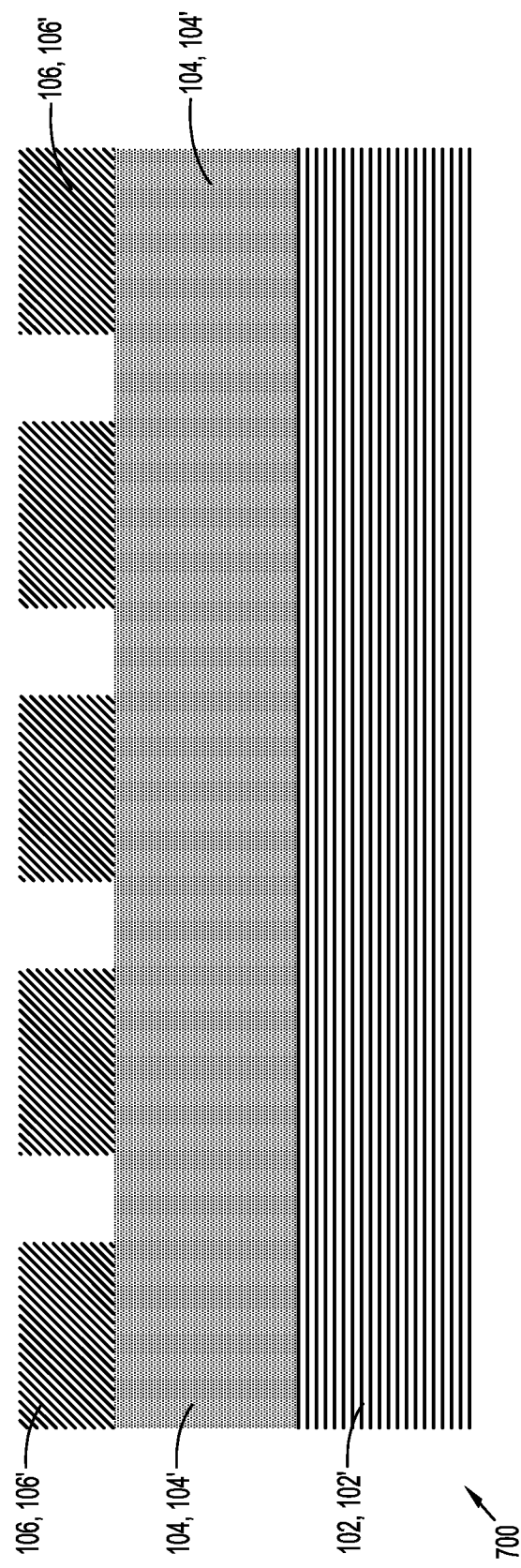
FIG. 7 is a cross-sectional view of a semiconductor structure showing an etched hard mask layer after removal of remaining portions of the resist layer according to one or more illustrative embodiments of the present invention.

With reference now to FIG. 7, the remaining portions of the developed structure are then removed via conventional methodologies resulting in the semiconductor structure 700. The resist layer 112, 112' modified by the SIS process may be removed using solvent systems or other techniques known in the art.

The semiconductor structure 700 is then subjected to additional processing operations of a type well known to those skilled in the art, in order to form desired integrated circuit structures on the semiconductor wafer. For example, portions of the process as previously described in conjunction with FIGS. 1 through 7 can be repeated with different pattern masks in order to further configure the hard mask layer in accordance with additional pattern features.

In other embodiments, other types of multi-layer patterning material film stacks may be used. For example, in some embodiments, additional or alternative layers may be included in the patterning material film stack with the hard mask layer and the resist layer. These and numerous other lithographic patterning arrangements using a film stack configured to support selective infiltration of one or more precursors on a patterned resist layer can be implemented using the techniques disclosed herein, as will be appreciated by those skilled in the art.

Illustrative embodiments can include a semiconductor structure comprising a semiconductor substrate and a multi-layer patterning material film stack formed on the semiconductor substrate. The patterning material film stack comprises at least a hard mask layer and a patterned resist layer formed over the hard mask layer. The film stack is configured to support selective infiltration of one or more precursors distributed in an SIS process into the patterned resist layer through inclusion in the hard mask layer of one or more materials inhibiting infiltration of the one or more precursors on portions of the hard mask layer corresponding to respective openings in the resist layer.

Other illustrative embodiments can include a multi-layer patterning material film stack comprising a hard mask layer and a resist layer formed over the hard mask layer. The resist layer includes one or more materials or coatings facilitating the infiltration of the one or more precursors of the SIS process therein and minimizing deposition of the precursors onto portions of the hard mask layer aligned with the openings in the resist layer. The hard mask layer may be formed over a semiconductor substrate or on other types of substrates, layers or materials.

Additional illustrative embodiments include lithography tools and other types of lithographic patterning equipment that are configured to perform lithographic processes such as those described above in conjunction with the manufacture of semiconductor integrated circuits. For example, an EUV lithography tool such as the ASML NXE:3300B or NXE:3350B operating at a wavelength of 13.5 nm can be modified to perform an EUV lithography process of the type described above, where such a lithography process includes forming a hard mask layer configured to support selective infiltration of one or more precursors of an SIS process onto a patterned resist layer using the techniques disclosed herein. Again, other types of lithography processes and associated lithography tools can be used, based on patterning radiation at DUV wavelengths or other wavelengths, and the techniques disclosed herein are therefore not limited to use with EUV lithography processes or EUV lithography tools.

Examples of integrated circuit structures that can be formed using EUV lithography processes as disclosed herein include nanosheet metal-oxide-semiconductor field-effect transistor (MOSFET) devices. The use of a hard mask layer configured to support selective infiltration of one or more precursors of an SIS technique as disclosed herein can facilitate the manufacture of such devices by allowing an increase in resist height while also avoiding pattern transfer defects such as line breaks, thereby facilitating the formation of sub-10 nm features. Similar improvements are provided for alternative ranges of feature sizes, such as sub-50 nm features. A wide variety of other types of integrated circuit devices can be fabricated using an EUV lithography process that includes one or more iterations of at least portions of the steps shown in FIGS. 1 through 7.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

It is to be understood that the various layers, structures, and/or regions described above are not necessarily drawn to scale. In addition, for ease of explanation one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Terms such as "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Also, in the figures, the illustrated scale of one layer, structure, and/or region relative to another layer, structure, and/or region is not necessarily intended to represent actual scale.

Semiconductor devices and methods for forming same in accordance with the above-described techniques can be employed in various applications, hardware, and/or electronic systems, including but not limited to personal computers, communication networks, electronic commerce systems, portable communications devices (e.g., cell and smart phones), solid-state media storage devices, functional circuitry, etc. Given the teachings provided herein, one of ordinary skill in the art will be able to contemplate other implementations and applications of embodiments of the invention.

In some embodiments, the above-described techniques are used in connection with manufacture of semiconductor integrated circuit devices that illustratively comprise, by way of non-limiting example, CMOS devices, MOSFET devices, and/or FinFET devices, and/or other types of semiconductor integrated circuit devices that incorporate or otherwise utilize CMOS, MOSFET, and/or FinFET technology.

Accordingly, at least portions of one or more of the semiconductor structures described herein may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   depositing a resist layer onto a hard mask layer to form a multi-layer patterning material film stack on a semiconductor substrate;
   directing patterning radiation onto the film stack to form a developed pattern in the resist layer;
   exposing the film stack to at least one gas precursor in connection with a sequential infiltration synthesis process wherein the film stack is configured to facilitate selective infiltration of the at least one gas precursor into the resist layer to modify at least one characteristic of the resist layer, and
   grafting a polymer brush material to at least portions of the hard mask layer, the polymer brush material impeding infiltration of the at least one precursor into the hard mask layer.

2. The method of claim 1 wherein grafting the polymer brush material includes grafting a polymer brush onto the at least portions of the hard mask layer corresponding to openings in the developed pattern of the resist layer.

3. The method of claim 2 wherein grafting the polymer brush material is performed subsequent to directing patterning radiation.

4. The method of claim 2 wherein grafting the polymer brush material is performed prior to depositing the resist layer.

5. The method of claim 2 wherein the polymer brush material includes one of polystyrene, copolymers of polystyrene, or a self-assembled monolayer having an aromatic content.

6. The method of claim 1 including grafting a self-assembled monolayer onto at least portions of the resist layer.

7. The method of claim 6 wherein the monolayer is configured to facilitate infiltration of the at least one gas precursor into the resist layer.

8. The method of claim 7 wherein the monolayer includes one of an acrylate-based unit or a polymethacrylate based polymer brush.

9. The method of claim 1 including:
   etching the hard mask layer in accordance with the developed pattern; and
   removing remaining portions of the resist layer.

10. The method of claim 1 wherein directing patterning radiation includes utilizing extreme ultraviolet lithography.

11. A multi-layered patterning film stack, comprising:
    a hard mask layer; and
    a patterned resist layer on the hard mask layer,
    wherein one of the hard mask layer and the resist layer is configured to facilitate selective infiltration of at least one gas precursor of a sequential infiltration synthesis process into the resist layer to modify at least one characteristic of the resist layer; and
    wherein the hard mask layer includes a polymer brush material configured to impede infiltration of the at least one precursor into the hard mask layer.

12. The film stack of claim 11 wherein the polymer brush material is grafted on the hard mask layer within portions corresponding to openings in the resist layer.

13. The film stack of claim 12 wherein the polymer brush material includes polystyrene.

14. The film stack of claim 11 wherein the resist layer includes a self-assembled monolayer graft disposed onto at least portions of the resist layer, the monolayer graft facilitating infiltration of the at least one gas precursor into the resist layer.

15. The method of claim 14 wherein the monolayer graft includes polymethacrylate.

16. A semiconductor structure comprising:
a semiconductor substrate; and
a multi-layer patterning material film stack disposed on the semiconductor substrate, the film stack comprising at least a hard mask layer and a resist layer disposed over the hard mask layer, the resist layer having a desired pattern to modify at least one characteristic of the resist layer;
wherein the film stack is configured to facilitate selective infiltration of at least one gas precursor of a sequential infiltration synthesis process into the resist layer; and
wherein the film stack includes a polymer brush graft material on at least portions of the hard mask layer, the polymer brush graft material impeding infiltration of the at least one precursor into the hard mask layer.

17. The semiconductor substrate of claim 16 wherein the film stack includes a self-assembled monolayer graft disposed onto at least portions of the resist layer, the monolayer graft facilitating infiltration of the at least one gas precursor into the resist layer.

18. The semiconductor substrate of claim 16 wherein the polymer brush graft material is disposed within portions corresponding to openings in the patterned resist layer.

19. The semiconductor substrate of claim 16 wherein the polymer brush graft material comprises one of polystyrene, copolymers of polystyrene, or a self-assembled monolayer having an aromatic content.

20. The semiconductor substrate of claim 17 wherein the monolayer graft includes one of an acrylate-based unit or a polymethacrylate based polymer brush.

* * * * *